United States Patent
Engel (10) Patent No.: US 11,353,490 B2
(45) Date of Patent: Jun. 7, 2022

(54) SYSTEMS AND METHODS FOR MONITORING VOLTAGE OF VEHICLE ONBOARD BATTERY CHARGER

(71) Applicant: Dr. Ing. h.c. F. Porsche Aktiengesellschaft, Stuttgart (DE)

(72) Inventor: Joseph A. Engel, Differdange (LU)

(73) Assignee: Dr. Ing. h.c. F. Porsche Aktiengesellschaft, Stuttgart (DE)

(*) Notice: Subject to any disclaimer, the term of this patent is extended or adjusted under 35 U.S.C. 154(b) by 470 days.

(21) Appl. No.: 16/558,656

(22) Filed: Sep. 3, 2019

(65) Prior Publication Data

US 2021/0063458 A1     Mar. 4, 2021

(51) Int. Cl.
| | |
|---|---|
| *G01R 31/00* | (2006.01) |
| *B60L 53/62* | (2019.01) |
| *B60L 3/04* | (2006.01) |
| *H02J 7/02* | (2016.01) |
| *B60K 6/22* | (2007.10) |

(52) U.S. Cl.
CPC .............. *G01R 31/007* (2013.01); *B60L 3/04* (2013.01); *B60L 53/62* (2019.02); *H02J 7/027* (2013.01); *B60K 6/22* (2013.01); *B60Y 2200/91* (2013.01); *B60Y 2200/92* (2013.01); *B60Y 2300/91* (2013.01)

(58) Field of Classification Search
CPC ......... G01R 31/007; B60L 53/62; B60L 3/04; H02J 7/027; B60K 6/22; B60Y 2200/91; B60Y 2200/92; B60Y 2300/91
USPC ........................................................ 320/137
See application file for complete search history.

(56) References Cited

U.S. PATENT DOCUMENTS

| | | | |
|---|---|---|---|
| 4,209,741 A | 6/1980 | Coby et al. | |
| 5,281,920 A | 1/1994 | Wurst | |
| 5,635,815 A * | 6/1997 | Whitchurch | ...... H01M 10/4242 320/132 |
| 5,821,757 A | 10/1998 | Alvarez et al. | |
| 6,265,881 B1 | 7/2001 | Meliopoulos et al. | |
| 6,493,243 B1 * | 12/2002 | Real | ......... H02J 9/062 307/66 |

(Continued)

FOREIGN PATENT DOCUMENTS

| | | | | |
|---|---|---|---|---|
| CA | 2742453 A1 * | 12/2011 | ............ | H01M 10/46 |
| CN | 100421331 C * | 9/2008 | .............. | H02J 9/062 |

(Continued)

*Primary Examiner* — Suresh Memula
(74) *Attorney, Agent, or Firm* — Leydig, Voit & Mayer, Ltd.

(57) ABSTRACT

A method for detecting a fault in a battery charger circuit of a vehicle includes determining, based on at least one expected voltage value of an incoming alternating current source, a first threshold. The method also includes measuring at least one line voltage value associated with the incoming alternating current source that provides power to the battery charger circuit. The method also includes determining whether the measured at least one line voltage value is greater than the first threshold. The method also includes in response to a determination that the measured at least one line voltage value is greater than the first threshold, disconnecting the battery charger circuit from and/or preventing the battery charger circuit from connecting to the incoming alternating current source after a first predetermined period.

20 Claims, 4 Drawing Sheets

(56) References Cited

U.S. PATENT DOCUMENTS

| | | | |
|---|---|---|---|
| 10,237,946 B1 * | 3/2019 | Hsia | H02J 7/34 |
| 2006/0221531 A1 | 10/2006 | Nagata | |
| 2007/0228835 A1 * | 10/2007 | Varzhabedian | H02J 7/027 |
| | | | 307/66 |
| 2013/0127418 A1 * | 5/2013 | Oh | H02J 7/04 |
| | | | 320/109 |
| 2015/0115874 A1 | 4/2015 | Magnusson et al. | |
| 2015/0380968 A1 * | 12/2015 | Lee | G06F 1/30 |
| | | | 713/300 |
| 2016/0243954 A1 * | 8/2016 | Moro | B60L 53/14 |
| 2016/0280083 A1 | 9/2016 | Takei et al. | |
| 2017/0259669 A1 | 9/2017 | Eckert et al. | |
| 2021/0170899 A1 * | 6/2021 | Wang | B60L 58/20 |
| 2021/0237610 A1 * | 8/2021 | Zheng | H02J 7/0031 |
| 2021/0370789 A1 * | 12/2021 | Kawai | B60L 53/62 |
| 2022/0009373 A1 * | 1/2022 | Patel | B60L 58/24 |

FOREIGN PATENT DOCUMENTS

| | | | | |
|---|---|---|---|---|
| DE | 102021100168 A1 * | 7/2021 | | B60L 3/00 |
| FR | 2603993 B1 | 11/1988 | | |
| JP | 4663404 B2 | 4/2011 | | |
| KR | 20170105214 A * | 9/2017 | | |
| WO | WO-2013151007 A1 * | 10/2013 | | B60L 11/14 |
| WO | WO-2013179134 A1 * | 12/2013 | | H02J 9/02 |

* cited by examiner

SYSTEMS AND METHODS FOR MONITORING VOLTAGE OF VEHICLE ONBOARD BATTERY CHARGER

TECHNICAL FIELD

This disclosure relates to vehicle onboard battery chargers and in particular to systems and methods for monitoring voltage of vehicle onboard battery chargers.

BACKGROUND

Vehicles, such as cars, trucks, sport utility vehicles, crossovers, mini-vans, or other suitable vehicles, include a powertrain system that includes, for example, a propulsion unit, a transmission, drive shafts, wheels, and other suitable components. The propulsion unit may include an internal combustion engine, a fuel cell, one or more electric motors, and the like. A hybrid vehicle may include a powertrain system comprising more than one propulsion unit. For example, a hybrid vehicle may include an internal combustion engine and an electric motor that cooperatively operate to propel the vehicle.

In an electric powered vehicle, such as a hybrid vehicle or purely electric vehicle, one or more batteries supply power to one or more electric motors of the electric powered vehicle. Such batteries are typically charged when the electric power vehicle is not in use. For example, an operator of the electric powered vehicle may connect the vehicle to an electric grid (e.g., through a wall outlet in a home or other suitable connection to the electric grid). The electric grid may supply power to a battery charger circuit, which controls power flow to the one or more batteries in order to recharge the batteries.

SUMMARY

This disclosure relates generally to vehicle onboard battery charger systems and methods.

An aspect of the disclosed embodiments is a method for detecting a fault in a battery charger circuit of a vehicle. The method includes determining, based on at least one expected voltage value of an incoming alternating current source, a first threshold. The method also includes measuring at least one line voltage value associated with the incoming alternating current source that provides power to the battery charger circuit. The method also includes determining whether the measured at least one line voltage value is greater than the first threshold. The method also includes in response to a determination that the measured at least one line voltage value is greater than the first threshold, disconnecting the battery charger circuit from and/or preventing the battery charger circuit from connecting to the incoming alternating current source after a first predetermined period.

Another aspect of the disclosed embodiments is an apparatus for detecting a fault in a battery charger circuit. The apparatus includes a memory and a processor. The processor being configured to execute instructions stored on the memory to: determine, based on at least one expected voltage value of an incoming alternating current source, a first threshold; measure at least one line voltage value associated with the incoming alternating current source that provides power to the battery charger circuit; determine whether the measured at least one line voltage value is greater than the first threshold; and in response to a determination that the measured at least one line voltage value is greater than the first threshold, disconnect the battery charger circuit from and/or prevent the battery charger circuit from connecting to the incoming alternating current source after a first predetermined period.

Another aspect of the disclosed embodiments is a non-transitory computer-readable storage medium that includes executable instructions that, when executed by a processor, facilitate performance of operations, comprising: determining, based on at least one expected voltage value of an incoming alternating current source that provides power to a battery charger circuit of a vehicle, a first threshold and a second threshold; measuring at least one line voltage value associated with the incoming alternating current source; determining whether the measured at least one line voltage value is greater than the first threshold; in response to a determination that the measured at least one line voltage value is greater than the first threshold, disconnecting the battery charger circuit from and/or preventing the battery charger circuit from connecting to the incoming alternating current source after a first predetermined period; in response to a determination that the measured at least one line voltage value is not greater than the first threshold a value, determining whether the measured at least one line voltage value is greater than the second threshold; and in response to a determination that the measured at least one voltage value is greater than the second threshold, disconnect the battery charger circuit from and/or preventing the battery charger circuit from connecting to the incoming alternating current source after a second predetermined period.

These and other aspects of the present disclosure are provided in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Vehicles, such as cars, trucks, sport utility vehicles, crossovers, mini-vans, or other suitable vehicles, include a powertrain system that includes, for example, a propulsion unit, a transmission, drive shafts, wheels, and other suitable components. The propulsion unit may include an internal combustion engine, a fuel cell, one or more electric motors, and the like. A hybrid vehicle may include a powertrain system comprising more than one propulsion unit. For example, a hybrid vehicle may include an internal combustion engine and an electric motor that cooperatively operate to propel the vehicle.

In an electric powered vehicle, such as a hybrid vehicle or purely electric vehicle, one or more batteries supply power to one or more electric motors (e.g., and various other components) of the electric powered vehicle. Such batteries are typically charged when the electric power vehicle is not in use. An operator of the electric powered vehicle may connect the vehicle to an electric grid. For example, the operator may connect a power cable to a wall outlet in a home, commercial location, or other suitable location to connect to the electric grid. The electric grid supplies alternating current power, which is converted to a set alternating current voltage at the wall outlet (e.g., 110 volts, 120 volts, 220 volts, 230 volts, or other suitable voltage value, which may vary based on region). The wall outlet, using power from the electric grid, supplies power to a battery charger circuit, which controls power flow to the one or more batteries in order to recharge the batteries.

Typically, such a battery charger circuit includes a protective earth connection, which provides a primary protection against touch currents and voltages on various components (e.g., conductive components, such as the chassis, body, and other metal or conductive components) of the vehicle. For example, during use (e.g., when the vehicle is connected to the electric grid), the protective earth connection is configured to reduce or maintain touch current and voltages, such that the operator is protected from dangerously high current values and voltage values when the operator comes in contact with the various components of the vehicle.

In typical systems, a controller of the vehicle may sense, measure, or monitor an impedance value of the protective earth connection. If the controller determines that the impedance value is above a threshold (e.g., to high), the controller may disconnect the battery charger circuit from and/or prevent the battery charger circuit from connecting to the wall outlet, to prevent power from flowing from the electric grid through the wall outlet to the battery charger circuit and causing dangerous touch currents and voltages.

Typically, the controller measures the impedance value of the protective earth connection by injecting one or more known current values into the battery charger circuit and detecting a resulting voltage value. The inject current values and times at which they are inject, are selected, such that relative current protection devices of the vehicle are not triggering and the period of the test pulse (e.g., of the injected current values) is selected to provide a suitable range of reading and a reduced exposure to noise. Various solutions exist that use the readings (e.g., VSNS readings) to suitable place the test pulse.

Such a method for monitoring the protective earth connection of a battery charger circuit and for determining whether to disconnect the battery charger circuit from electric grid (e.g., via the wall outlet) is typically limited to resistance measurements. Accordingly, systems and methods, such as those described herein, configured to provide additional measurements, and to assist in the determination of whether to disconnect the battery charger circuit from and/or prevent the battery charger circuit from connecting to the electric grid, may be desirable. In some embodiments, the systems and methods described herein may be configured to, in addition or alternatively to monitoring the impedance value of the protective earth connection, determine expected voltage values of an incoming alternating current source (e.g., from the wall outlet) that provides power to the battery charger circuit. The systems and methods described herein may be configured to determine, based on the expected voltage values, various thresholds, including a first threshold and a second threshold. The systems and methods described herein may be configured to measure live voltage values associated with the incoming alternating current source. The systems and methods described herein may be configured to determine whether the measured line voltage values are greater than the first threshold and may disconnect the battery charger circuit from and/or prevent the battery charger circuit from connecting to the incoming alternating current source after a first predetermined period (e.g., a relatively small period, such as immediately or substantially immediately). The first threshold may be a voltage value indicative of a fault or an incipient fault occurring in the battery charger circuit or other component of the vehicle that may increase touch currents and voltages.

In some embodiments, the systems and methods described herein may be configured to determine, in response to the line voltage values not being greater than the first threshold, whether the line voltage values are greater than the second threshold. The first threshold may be greater than the second threshold. The second threshold may be a voltage value indicative of a potential fault occurring in the battery charger circuit or other component of the vehicle that may increase touch currents and voltages. As such, the systems and methods described herein may determine whether to disconnect the battery charger circuit from and/or prevent the battery charger circuit from connecting to the alternating current source after a second predetermined period, which may be longer than the first predetermined period (e.g., if the line voltages drop below the second threshold before the second predetermined period, the line voltage values may indicate that no fault is occurring). As will be described, various embodiments of the systems and methods described herein may include additional, fewer, or different features than those described above.

In some embodiments, the systems and methods described herein may be configured to monitor voltage supply relative to the chassis of the vehicle. Additionally, or alternatively, the electric grid may be configured to be compliant with a predefined scheme. The systems and methods described herein may be configured to detect the predefined scheme (e.g., be programed with the scheme details or use various inputs to determine the scheme) and may be configured to determine the expected voltage values based on the scheme. An earth connection associated with the wall outlet may be part of the scheme and may be set to a fixed voltage range in relation to the other lines of the alternating current source. The earth connection of the wall outlet may be connect to the protective earth connection of the battery charger circuit. If the earth connection voltage value is greater than the expected range, regardless of the impedance value of the protective earth connection being measured as low (e.g., within an acceptable range), the systems and methods described herein may determine to disconnect the battery charger circuit from and/or prevent the battery charger circuit from connecting to the alternating current source.

In some embodiments, the electric grid may include power lines that are isolated from the earth and a connection of the vehicle to protective earth connection. The systems and methods described herein may be configured to identify errors in various components of the electric grid and/or the battery charger circuit and selectively disconnect the battery charger circuit from and/or prevent the battery charger circuit from connecting to the incoming alternating current source.

Figure 1:
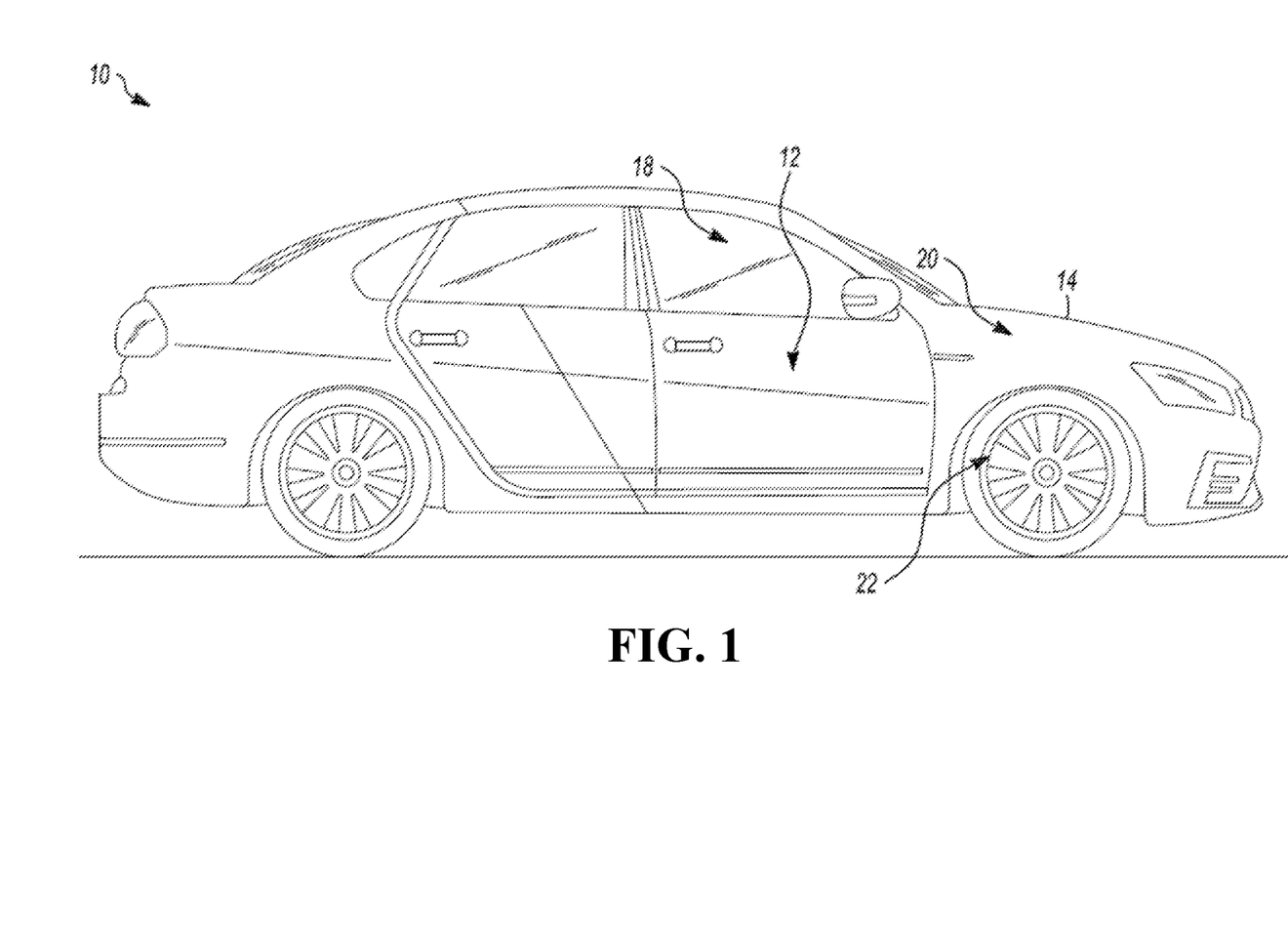
FIG. 1 generally illustrates a vehicle according to the principles of the present disclosure.

FIG. 1 generally illustrates a vehicle 10 according to the principles of the present disclosure. The vehicle 10 may include any suitable vehicle, such as a car, a truck, a sport utility vehicle, a mini-van, a crossover, any other passenger vehicle, any suitable commercial vehicle, or any other suitable vehicle. While the vehicle 10 is illustrated as a passenger vehicle having wheels and for use on roads, the principles of the present disclosure may apply to other vehicles, such as planes, boats, trains, drones, or other suitable vehicles. The vehicle 10 includes a vehicle body 12 and a hood 14. A portion of the vehicle body 12 defines a passenger compartment 18. Another portion of the vehicle body 12 defines the engine compartment 20. The hood 14 may be moveably attached to a portion of the vehicle body 12, such that the hood 14 provides access to the engine compartment 20 when the hood 14 is in a first or open position and the hood 14 covers the engine compartment 20 when the hood 14 is in a second or closed position.

The passenger compartment 18 may be disposed rearward of the engine compartment 20. The vehicle 10 may include any suitable propulsion system including an internal combustion engine, one or more electric motors (e.g., an electric vehicle), one or more fuel cells, a hybrid (e.g., a hybrid vehicle) propulsion system comprising a combination of an internal combustion engine, one or more electric motors, and/or any other suitable propulsion system. In some embodiments, the vehicle 10 may include a petrol or gasoline fuel engine, such as a spark ignition engine. In some embodiments, the vehicle 10 may include a diesel fuel engine, such as a compression ignition engine. The engine compartment 20 houses and/or encloses at least some components of the propulsion system of the vehicle 10. Additionally, or alternatively, propulsion controls, such as an accelerator actuator (e.g., an accelerator pedal), a brake actuator (e.g., a brake pedal), a steering wheel, and other such components are disposed in the passenger compartment 18 of the vehicle 10. The propulsion controls may be actuated or controlled by a driver of the vehicle 10 and may be directly connected to corresponding components of the propulsion system, such as a throttle, a brake, a vehicle axle, a vehicle transmission, and the like, respectively. In some embodiments, the propulsion controls may communicate signals to a vehicle computer (e.g., drive by wire) which in turn may control the corresponding propulsion component of the propulsion system.

In some embodiments, the vehicle 10 includes a transmission in communication with a crankshaft via a flywheel, clutch, or fluid coupling. In some embodiments, the transmission includes a manual transmission. In some embodiments, the transmission includes an automatic transmission. The vehicle 10 may include one or more pistons, in the case of an internal combustion engine or a hybrid vehicle, which cooperatively operate with the crankshaft to generate force, which is translated through the transmission to one or more axles, which turns wheels 22.

When the vehicle 10 includes one or more electric motors, a vehicle battery, and/or fuel cell provides energy to the electric motors to turn the wheels 22. In cases where the vehicle 10 includes a vehicle battery to provide energy to the one or more electric motors, when the battery is depleted, it may be connected to an electric grid (e.g., using a wall socket) to recharge the battery cells. Additionally, or alternatively, the vehicle 10 may employ regenerative braking which uses the one or more electric motors of the vehicle 10 as a generator to convert kinetic energy lost due to decelerating back into stored energy in the battery.

The vehicle 10 may include automatic vehicle propulsion systems, such as a cruise control, an adaptive cruise control module or mechanism, automatic braking control, other automatic vehicle propulsion systems, or a combination thereof. The vehicle 10 may be an autonomous or semi-autonomous vehicle, or other suitable type of vehicle. The vehicle 10 may include additional or fewer features than those generally illustrated and/or disclosed herein.

Figure 2:
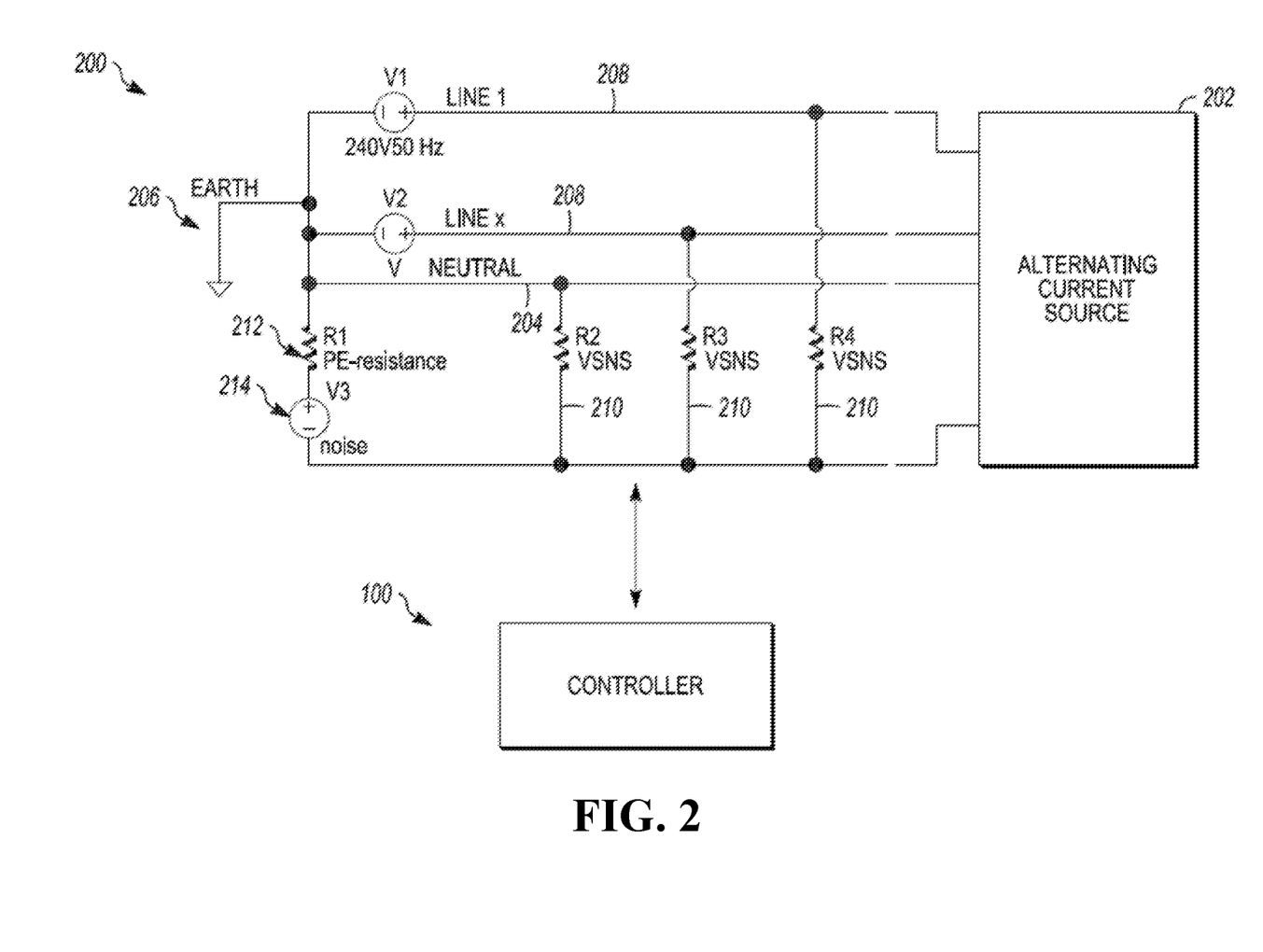
FIG. 2 generally illustrates a circuit diagram according to the principles of the present disclosure.

As described the vehicle 10 may include an electric powered vehicle, such as a hybrid vehicle or a purely electric vehicle. The vehicle 10, as described, may include one or more electric motors that receive power or energy from one or more batteries within the vehicle. The one or more batteries may include or be connected to respective vehicle onboard battery charger that provide power to respective batteries to recharge the respective batteries for use. FIG. 2 generally illustrates a battery charger circuit 200 in communication with a controller 100. The controller 100 may be any suitable controller within the vehicle, such as an electric control unit, a vehicle control unit, or other suitable vehicle onboard controller. The controller 100 may include a processor and a memory. The memory may be configured to store instructions executable by the processor. For example, the processor may execute the instructions stored memory to perform various functions and methods described herein. The controller 100 may be configured to control various aspects of the vehicle. For example, the controller 100 may be configured to detect faults in the battery charger circuit 200 and selectively disconnect the battery charger circuit 200 from a power source.

As described, the battery charger circuit 200 may be associated with an onboard battery charger that supplies power to a respective battery of the vehicle 10 for recharging the respective battery. The battery charger circuit 200 may be connected to an alternating current source 202. The alternating current source 202 may include a wall outlet connected to an electric grid, as described. The alternating current source 202 provides alternating current power to the battery charger circuit 200. The battery charger circuit 200 may connect the alternating current power to various suitable power and may provide the power to the one or more batteries of the vehicle 10.

The alternating current source 202 may include any suitable phase type or scheme. For example, FIG. 3A generally illustrates a three-phase power source scheme and FIG. 3B generally illustrates a split-phase power source scheme. It should be understood that the alternating current source 202 may include any suitable phase type power source scheme.

In some embodiments, the controller 100 is configured to determine scheme of the alternating current source 202. For example, the controller 100 may receive the scheme of the alternating current source 202 from a user or operator of the vehicle via an input device of the vehicle. Additionally, or alternatively, the controller 100 may be configured to determine the scheme based on the amplitude of the incoming power from the alternating current source 202, the connection type of the alternating current source 202, other characteristics of the alternating current source 202, or a combination thereof. In some embodiments, the controller 100 may communicate with a remotely located computing device, such as a cloud-computing device or other suitable remotely located computing device, to obtain or receive the scheme of the alternating current source 202. In some embodiments, the scheme may be indicated by an industrial standard, which may be received or obtained by the controller 100, as described.

In some embodiments, the controller 100 is configured to determine one or more expected voltage values or an expected voltage value range of the alternating current source 202. For example, the controller 100 may receive the expected voltage values or expected voltage value ranges from the user or operator via the input device in the vehicle. Additionally, or alternatively, the controller 100 may measure voltage values of the alternating current source 202 and determine average operating voltage values associated with the alternating current source 202. The controller 100 may use the average operating voltage values as the expected voltage values of the alternating current source 202. In some embodiments, the controller 100 may communicate with a remotely located computing device, such as a cloud-computing device or other suitable remotely located computing device, to obtain or receive the expected voltage values or the expected voltage value range of the alternating current source 202. In some embodiments, the expected voltage values or the expected voltage range may be indicated by the industrial standard corresponding to the scheme, which may be received or obtained by the controller 100, as described.

Figure 3A:
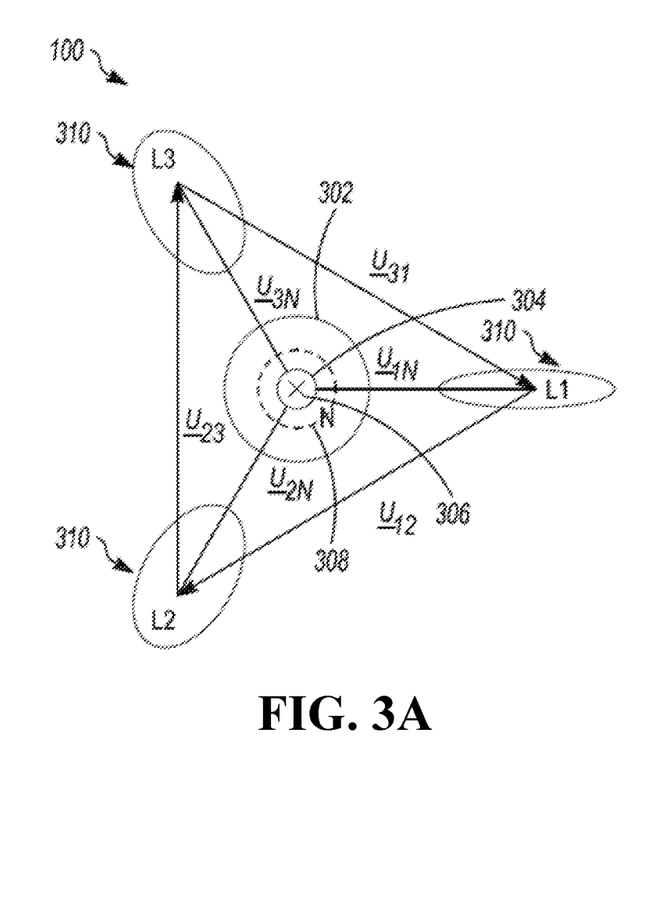
FIG. 3A generally illustrates three-phase electrical system according to the principles of the present disclosure.

With referenced to FIG. 3A, an expected range for neutral line of the alternating current source 202 is illustrated at 302. The neutral line of the alternating current source 202 may be connected to a neutral line 204 of the battery charger circuit 200. An actual (e.g., measured) range for the neutral line of the alternating current source 202 prior to an on state of the alternating current source 202 is illustrated at 304. The on state may include a state of alternating current source 202 corresponding to the alternating current source 202 providing power to the battery charger circuit 200 (e.g., in response to the battery charger circuit 200 being turned on to charge the battery). As described, the battery charger circuit 200 includes a protective earth connection 206. The protective earth connection 206 may be connected to an earth connection of the alternating current source 202. The earth connection expected voltage value range is illustrated at 306.

An acceptable voltage value limit (e.g., when the alternating current source 202 is in the on state) is illustrated at 308. The battery charger circuit 200 includes one or more lines 208. The one or more lines 208 may be connected to corresponding supply lines of the alternating current source 202. An expected voltage value range for supply lines associated with the alternating current source 202 is illustrated at 310. As described, the alternating current source 202 may include any suitable number of supply lines.

Figure 3B:
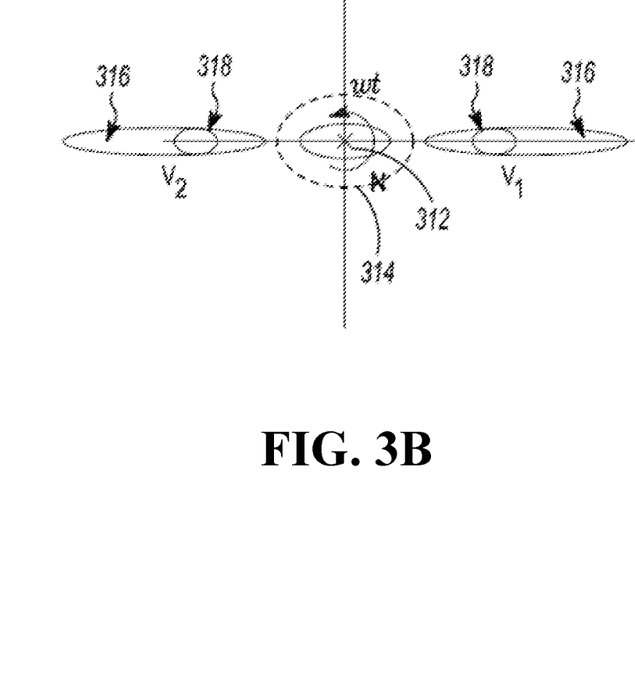
FIG. 3B generally illustrates a split-phase electrical system

As described, FIG. 3B generally illustrates a split-phase scheme of the alternating current source 202. The battery charger circuit 200 may be connected to alternating current source 202 when the alternating current source 202 includes a split-phase scheme in a similar manner as described above with respect to FIG. 3A. An earth connection voltage value range is illustrated at 312 and may be similar or different from the earth connection voltage value range 306. An acceptable voltage value limit (e.g., when the alternating current source 202 is in the on state) is illustrated at 314 and may be similar or different from the acceptable voltage value limit 308. An expected voltage value range for supply lines associated with the alternating current source 202 is illustrated at 316 and may be similar or different from the expected voltage value range for supply lines 310. An actual (e.g., measured) voltage value range for the supply lines of the alternating current source 202 is illustrated at 318. The split-phase scheme does not typically include a neutral line. Accordingly, the controller 100 may derive a virtual neutral relative to the chassis of the vehicle. The controller 100 may derive the virtual neutral using the supply line voltages from the alternating current source 202

In some embodiments, the alternating current source 202 may include a power source scheme that includes power lines that are isolated from the earth (e.g., ground) and the connection between the vehicle 10 and the protective earth connection 206.

As described, the controller 100 may determine one or more thresholds based on the expected voltage values or the expected voltage range of the alternating current source 202. For example, the controller 100 may determine a first threshold that is equal to, slightly greater than, or slightly less than the expected voltage values or upper limit of the expected voltage range of the alternating current source 202. The first threshold may be a value that indicates that the measured voltage values of the alternating current source 202 are indicative of a fault. Additionally, or alternatively, the controller 100 may determine a second threshold that is less than the expected voltage values or between the upper limit and the lower limit of the expected voltage value range. The second threshold may be a value that indicates that the measured voltage values of the alternating current source 202 are indicative of a potential fault. It should be understood that the first threshold and the second threshold may be any suitable value. Additionally, or alternatively, the controller 100 may determine any suitable number of thresholds.

With reference to FIG. 2, the battery charger circuit 200 includes various resistors 210. In some embodiments, the battery charger circuit 200 includes a protective earth connection resistor 212. The battery charger circuit 200 may include noise 214 that may be caused by various components in the battery charger circuit 200, the alternating current source 202, the battery, or other components of the vehicle 10. The noise 214 may influence measurements taken by the controller 100 of the battery charger circuit 200.

In some embodiments, the controller 100 measures one or more voltage values of one or more of the lines 208 of the battery charger circuit 200. The controller 100 may compare a measured voltage value of a respective line 208 to the first threshold. The controller 100 determines whether the measured voltage value is greater than the first threshold. When the controller 100 determines that the measured voltage value is greater than the first threshold, the controller 100 may disconnect the battery charger circuit 200 from and/or prevent the battery charger circuit 200 from connecting to the alternating current source 202 after a first predetermined period to prevent dangerous touch currents or voltages in the vehicle 10. The first predetermine period may be any suitable period, including substantially less than one second (e.g., immediately), one second, or any suitable period.

When the controller 100 determines that the measured voltage value is not greater than the first threshold, the controller 100 determines whether the measured voltage value is greater than the second threshold. When the controller 100 determines that the measured voltage value is greater than the second threshold, the controller 100 may disconnect the battery charger circuit 200 from and/or prevent the battery charger circuit 200 from connecting to the alternating current source 202 after a second predetermined period to prevent dangerous touch currents or voltages in the vehicle 10. The second predetermined period may be greater than the first predetermined period. For example, the second predetermined period may include five seconds, ten seconds, or any suitable period. The second predetermined period may allow time for the measured voltage values to be reduced, which may indicate that no fault is occurring. Conversely, when the measured voltage values are greater than the second threshold and less than the first threshold for the second predetermined period, the controller 100 determines that a fault is likely to occur, and respond according. When the controller determines the measured voltage value is not greater than the second threshold, the controller 100 continues to measure voltage values of the lines 208 of the battery charger circuit 200 and proceeds as described.

In some embodiments, the controller 100 may measure impedance values of the protective earth connection 206, and may disconnect the battery charger circuit 200 from and/or prevent the battery charger circuit 200 from connecting to the alternating current source 202 when the controller 100 determines that the measured impedance values of the protective earth connection 206 are above a threshold. Additionally, or alternatively, the controller 100 may use the measured impedance values of the protective earth connection 206 and the measured voltage values of the lines 208 to determine whether to disconnect the battery charger circuit 200 from and/or prevent the battery charger circuit 200 from connecting to the alternating current source 202. For example, the controller 100 may be configured to disconnect the battery charger circuit 200 from and/or prevent the battery charger circuit 200 from connecting to the alternating current source 202 in response to the measured impedance values being above a threshold and the measured voltage values being below the first and second thresholds, in response to the measured impedance values being below the threshold and the measured voltage values being above at least one of the first and second thresholds, in response to the measured impedance values being close to the threshold and the measured voltage values being close to at least one of the first and second thresholds, or any suitable combination of measured impedance values and measured voltage values.

Figure 4:
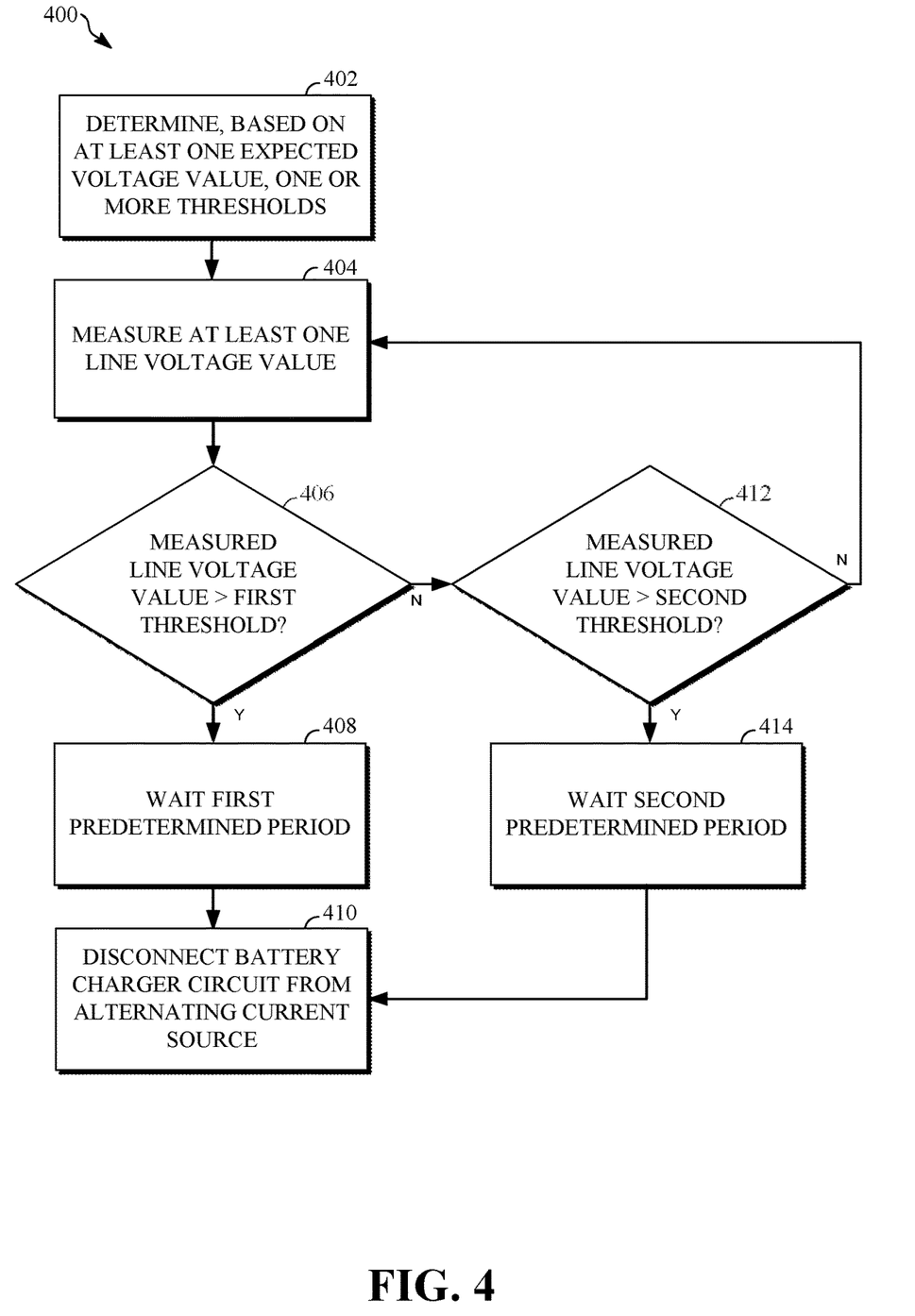
FIG. 4 is a flow diagram generally illustrating a battery charger circuit fault detection method according to the principles of the present disclosure.

In some embodiments, controller 100 may perform the methods described herein, such as the method 400. However, the methods described herein as performed by the controller 100 are not meant to be limiting, and any type of software executed on a controller can perform the methods described herein without departing from the scope of this disclosure. For example, any suitable controller, such as a processor executing software within a computing device onboard the vehicle 10, can perform the methods described herein.

FIG. 4 is a flow diagram generally illustrating a battery charger circuit fault detection method 400 according to the principles of the present disclosure. At 402, the method 400 determines, based on at least one expected voltage value, one or more thresholds. For example, the controller 100 may determine the first threshold based on one or more expected voltage values of the alternating current source 202. Additionally, or alternatively, the controller 100 may determine the second threshold based on the one or more expected voltage values of the alternating current source 202. At 404, the method 400 measures at least one line voltage value. For example, the controller 100 measures voltage values of the lines 208 of the battery charger circuit 200. At 406, the method 400 determines whether the line voltage value is greater than a first threshold. For example, the controller 100 determines whether a measured voltage value of a respective line 208 is greater than the first threshold. When the controller 100 determines that the measured voltage value is greater than the first threshold, the method 400 continues at 408. When the controller 100 determines that the measured voltage value is not greater than the first threshold, the method 400 continues at 412.

At 408, the method 400 waits a first predetermined period. For example, the controller 100 waits the first predetermined period. As described, the first predetermined period may be a relatively short period, such as significantly less than one second (e.g., immediately). At 410, the method 400 disconnects the battery charger circuit from and/or prevents the battery charger circuit from connecting to the alternating current source. For example, the controller 100 disconnects the battery charger circuit 200 from the alternating current source 202. In some embodiments, the controller 100 prevents the battery charger circuit 200 from connecting to the alternating current source 202.

At 412, the method 400 determines whether the measured voltage value is greater than the second threshold. For example, the controller 100 determines whether the measured voltage value is greater than the second threshold. When the controller 100 determines that the measured voltage value is not greater than the second threshold, the method 400 continues at 404. When the controller 100 determines that the measured voltage value is greater than the second threshold, the method continues at 414. At 414, the method 400 waits a second predetermined period. For example, the controller 100 waits the second predetermine period. The second predetermined period may be longer than the first predetermined period. The method 400 continues at 410.

In some embodiments, a method for detecting a fault in a battery charger circuit of a vehicle includes determining, based on at least one expected voltage value of an incoming alternating current source, a first threshold. The method also includes measuring at least one line voltage value associated with the incoming alternating current source that provides power to the battery charger circuit. The method also includes determining whether the measured at least one line voltage value is greater than the first threshold. The method also includes in response to a determination that the measured at least one line voltage value is greater than the first threshold, disconnecting the battery charger circuit from and/or preventing the battery charger circuit from connecting to the incoming alternating current source after a first predetermined period.

In some embodiments, the incoming alternating current source includes a three-phase alternating current source. In some embodiments, the incoming alternating current source includes a split-phase alternating current source. In some embodiments, the incoming alternating current source is associated with an alternating current grid. In some embodiments, the method also includes determining, based on the at least one expected voltage value of the incoming alternating current source, a second threshold, wherein the first threshold is greater than the second threshold. In some embodiments, the method also includes, in response to a determination that the measured at least one line voltage value is not greater than the first threshold a value, determining whether the measured at least one line voltage value is greater than the second threshold. In some embodiments, the method also includes, in response to a determination that the measured at least one voltage value is greater than the second threshold, disconnecting the battery charger circuit from and/or preventing the battery charger circuit from connecting to the incoming alternating current source after a second predetermined period, wherein the second predetermined period is greater than the first predetermined period.

In some embodiments an apparatus for detecting a fault in a battery charger circuit includes a memory and a processor. The processor being configured to execute instructions stored on the memory to: determine, based on at least one expected voltage value of an incoming alternating current source, a first threshold; measure at least one line voltage value associated with the incoming alternating current source that provides power to the battery charger circuit; determine whether the measured at least one line voltage value is greater than the first threshold; and in response to a determination that the measured at least one line voltage value is greater than the first threshold, disconnect the battery charger circuit from and/or prevent the battery charger circuit from connecting to the incoming alternating current source after a first predetermined period.

In some embodiments, the incoming alternating current source includes a three-phase alternating current source. In some embodiments, the incoming alternating current source includes a split-phase alternating current source. In some embodiments, the incoming alternating current source is associated with an alternating current grid. In some embodiments, the processor is further configured to determine, based on the at least one expected voltage value of the incoming alternating current source, a second threshold, wherein the first threshold is greater than the second threshold. In some embodiments, the processor is further configured to, in response to a determination that the measured at least one line voltage value is not greater than the first threshold a value, determine whether the measured at least one line voltage value is greater than the second threshold. In some embodiments, the processor is further configured to, in response to a determination that the measured at least one voltage value is greater than the second threshold, disconnect the battery charger circuit from and/or prevent the battery charger circuit from connecting to the incoming alternating current source after a second predetermined period, wherein the second predetermined period is greater than the first predetermined period.

In some embodiments, a non-transitory computer-readable storage medium includes executable instructions that, when executed by a processor, facilitate performance of operations, comprising: determining, based on at least one expected voltage value of an incoming alternating current source that provides power to a battery charger circuit of a vehicle, a first threshold and a second threshold; measuring at least one line voltage value associated with the incoming alternating current source; determining whether the measured at least one line voltage value is greater than the first threshold; in response to a determination that the measured at least one line voltage value is greater than the first threshold, disconnecting the battery charger circuit from and/or preventing the battery charger circuit from connecting to the incoming alternating current source after a first predetermined period; in response to a determination that the measured at least one line voltage value is not greater than the first threshold a value, determining whether the measured at least one line voltage value is greater than the second threshold; and in response to a determination that the measured at least one voltage value is greater than the second threshold, disconnect the battery charger circuit from and/or prevent the battery charger circuit from connecting to the incoming alternating current source after a second predetermined period.

In some embodiments, the first threshold is greater than the second threshold. In some embodiments, the second predetermined period is greater than the first predetermined period. In some embodiments, the incoming alternating current source includes a three-phase alternating current source. In some embodiments, the incoming alternating current source includes a split-phase alternating current source. In some embodiments, the incoming alternating current source is associated with an alternating current grid.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A method for detecting a fault in a battery charger circuit of a vehicle, the method comprising:
   determining, based on at least one expected voltage value of an incoming alternating current source, a first threshold;
   measuring at least one line voltage value associated with the incoming alternating current source that provides power to the battery charger circuit;
   determining whether the measured at least one line voltage value is greater than the first threshold; and
   in response to a determination that the measured at least one line voltage value is greater than the first threshold, disconnecting the battery charger circuit from the incoming alternating current source after a first predetermined period.

2. The method of claim 1, wherein the incoming alternating current source includes a three-phase alternating current source.

3. The method of claim 1, wherein the incoming alternating current source includes a split-phase alternating current source.

4. The method of claim 1, wherein the incoming alternating current source is associated with an alternating current grid.

5. The method of claim 1, further comprising, determining, based on the at least one expected voltage value of the incoming alternating current source, a second threshold, wherein the first threshold is greater than the second threshold.

6. The method of claim 5, further comprising, in response to a determination that the measured at least one line voltage value is not greater than the first threshold a value, determining whether the measured at least one line voltage value is greater than the second threshold.

7. The method of claim 6, further comprising, in response to a determination that the measured at least one voltage value is greater than the second threshold, disconnecting the battery charger circuit from the incoming alternating current source after a second predetermined period, wherein the second predetermined period is greater than the first predetermined period.

8. An apparatus for detecting a fault in a battery charger circuit, comprising:
   a memory; and
   a processor configured to execute instructions stored on the memory to:
      determine, based on at least one expected voltage value of an incoming alternating current source, a first threshold;
      measure at least one line voltage value associated with the incoming alternating current source that provides power to the battery charger circuit;
      determine whether the measured at least one line voltage value is greater than the first threshold; and
      in response to a determination that the measured at least one line voltage value is greater than the first threshold, preventing the battery charger circuit from connecting to the incoming alternating current source after a first predetermined period.

9. The apparatus of claim 8, wherein the incoming alternating current source includes a three-phase alternating current source.

10. The apparatus of claim 8, wherein the incoming alternating current source includes a split-phase alternating current source.

11. The apparatus of claim 8, wherein the incoming alternating current source is associated with an alternating current grid.

12. The apparatus of claim 8, wherein the processor is further configured to determine, based on the at least one expected voltage value of the incoming alternating current source, a second threshold, wherein the first threshold is greater than the second threshold.

13. The apparatus of claim 12, wherein the processor is further configured to, in response to a determination that the measured at least one line voltage value is not greater than the first threshold a value, determine whether the measured at least one line voltage value is greater than the second threshold.

14. The apparatus of claim 13 wherein the processor is further configured to, in response to a determination that the measured at least one voltage value is greater than the second threshold, prevent the battery charger circuit from connecting to the incoming alternating current source after a second predetermined period, wherein the second predetermined period is greater than the first predetermined period.

15. A non-transitory computer-readable storage medium, comprising executable instructions that, when executed by a processor, facilitate performance of operations, comprising:
   determining, based on at least one expected voltage value of an incoming alternating current source that provides power to a battery charger circuit of a vehicle, a first threshold and a second threshold;
   measuring at least one line voltage value associated with the incoming alternating current source;
   determining whether the measured at least one line voltage value is greater than the first threshold;
   in response to a determination that the measured at least one line voltage value is greater than the first threshold, disconnecting the battery charger circuit from the incoming alternating current source after a first predetermined period;
   in response to a determination that the measured at least one line voltage value is not greater than the first threshold a value, determining whether the measured at least one line voltage value is greater than the second threshold; and
   in response to a determination that the measured at least one voltage value is greater than the second threshold, disconnect the battery charger circuit from the incoming alternating current source after a second predetermined period.

16. The non-transitory computer-readable storage medium of claim 15, wherein the first threshold is greater than the second threshold.

17. The non-transitory computer-readable storage medium of claim 15, wherein the second predetermined period is greater than the first predetermined period.

18. The non-transitory computer-readable storage medium of claim 15, wherein the incoming alternating current source includes a three-phase alternating current source.

19. The non-transitory computer-readable storage medium of claim 15, wherein the incoming alternating current source includes a split-phase alternating current source.

20. The non-transitory computer-readable storage medium of claim 15, wherein the incoming alternating current source is associated with an alternating current grid.

\* \* \* \* \*